United States Patent
Lin

(10) Patent No.: US 6,343,016 B1
(45) Date of Patent: Jan. 29, 2002

(54) HEAT SINK

(75) Inventor: Chi-Hsung Lin, Taipei Hsien (TW)

(73) Assignee: Enlight Corporation (TW)

( * ) Notice: Subject to any disclaimer, the term of this patent is extended or adjusted under 35 U.S.C. 154(b) by 0 days.

(21) Appl. No.: 09/739,866

(22) Filed: Dec. 20, 2000

(51) Int. Cl.$^7$ ................................................ H05K 7/20
(52) U.S. Cl. ...................... 361/704; 361/707; 361/709; 361/710; 165/80.3; 165/185; 257/722
(58) Field of Search ................................. 361/704, 707, 361/709, 710, 717, 718; 257/706, 707, 722; 174/15.1, 16.1, 16.3; 165/80.2, 80.3, 185

(56) References Cited

U.S. PATENT DOCUMENTS

| | | | | |
|---|---|---|---|---|
| 5,435,384 A | * | 7/1995 | Wu ............................. | 165/185 |
| 5,529,120 A | * | 6/1996 | Howard et al. ............. | 165/166 |
| 5,915,463 A | * | 6/1999 | Romero et al. ............ | 165/80.3 |
| 6,173,758 B1 | * | 1/2001 | Ward et al. ................. | 165/80.3 |

FOREIGN PATENT DOCUMENTS

| | | | | |
|---|---|---|---|---|
| JP | 410190268 A | * | 7/1998 | ............. H05K/7/20 |
| JP | 02000332177 A | * | 11/2000 | ......... H01L/23/467 |

* cited by examiner

*Primary Examiner*—Leo P. Picard
*Assistant Examiner*—Boris L. Chervinsky
(74) *Attorney, Agent, or Firm*—Troxell Law Office PLLC

(57) ABSTRACT

A heat sink includes a flat base panel adapted for attaching to a CPU (central processing unit), a plurality of upright fins integral wit the flat base panel at the top, parallel air passageways defined by the upright fins and extended in Y-axis direction, the upright fins including parallel radiating fins arranged in parallel lines in X-axis direction at two sides of each air passageway, and flow guide fins arranged in lines in each air passageway between each two adjacent lines of parallel radiating fins and biased at an angle relative to the parallel radiating fins.

3 Claims, 4 Drawing Sheets

HEAT SINK

BACKGROUND OF THE INVENTION

The present invention relates to a heat sink for use to dissipate heat from, for example, a CPU, and more particularly, to a light, durable, high performance heat sink.

A variety of advanced computers of high operation speed have been continuously developed. When an advanced computer is in operation, the CPU of the mainboard produces much heat, and heat must be quickly carried away from the CPU so as not to affect normal operation of the CPU. Various heat sinks have been disclosed for dissipating heat from a CPU. FIG. 1 shows a heat sink for this purpose. This structure of heat sink is extruded from aluminum alloy to form a two-dimensional base member, and then the base member is secondarily cut to form a base panel and parallel radiating fins at the top side of the base panel. Because the radiating fins are longitudinally and transversely aligned, currents of air pass through straight air passages defined in between each two adjacent rows of radiating fins at a high speed, resulting in low heat dissipation efficiency.

SUMMARY OF THE INVENTION

The present invention has been accomplished to provide a heat sink, which eliminates the aforesaid drawback. According to one aspect of the present invention, the heat sink is made of magnesium or aluminum alloy through a combination procedure including extruding and die-casting. Therefore, the heat sink is light but strong, and has a three-dimensional profile for quick dissipation of heat. According to another aspect of the present invention, the heat sink comprises a flat base panel adapted for attaching to a CPU, a plurality of upright fins integral with the flat base panel at the top, and parallel air passageways defined by the upright fins and extended in Y-axis direction, the upright fins including parallel radiating fins arranged in parallel lines in X-axis direction at two sides of each air passageway, and flow guide fins arranged in lines in each air passageway between each two adjacent lines of parallel radiating fins and biased at an angle relative to the parallel radiating fins for causing whirlwinds to enhance heat dissipation efficiency when currents of air pass through the air passageways.

DETAILED DESCRIPTION OF THE PREFERRED EMBODIMENT

Figure 1:
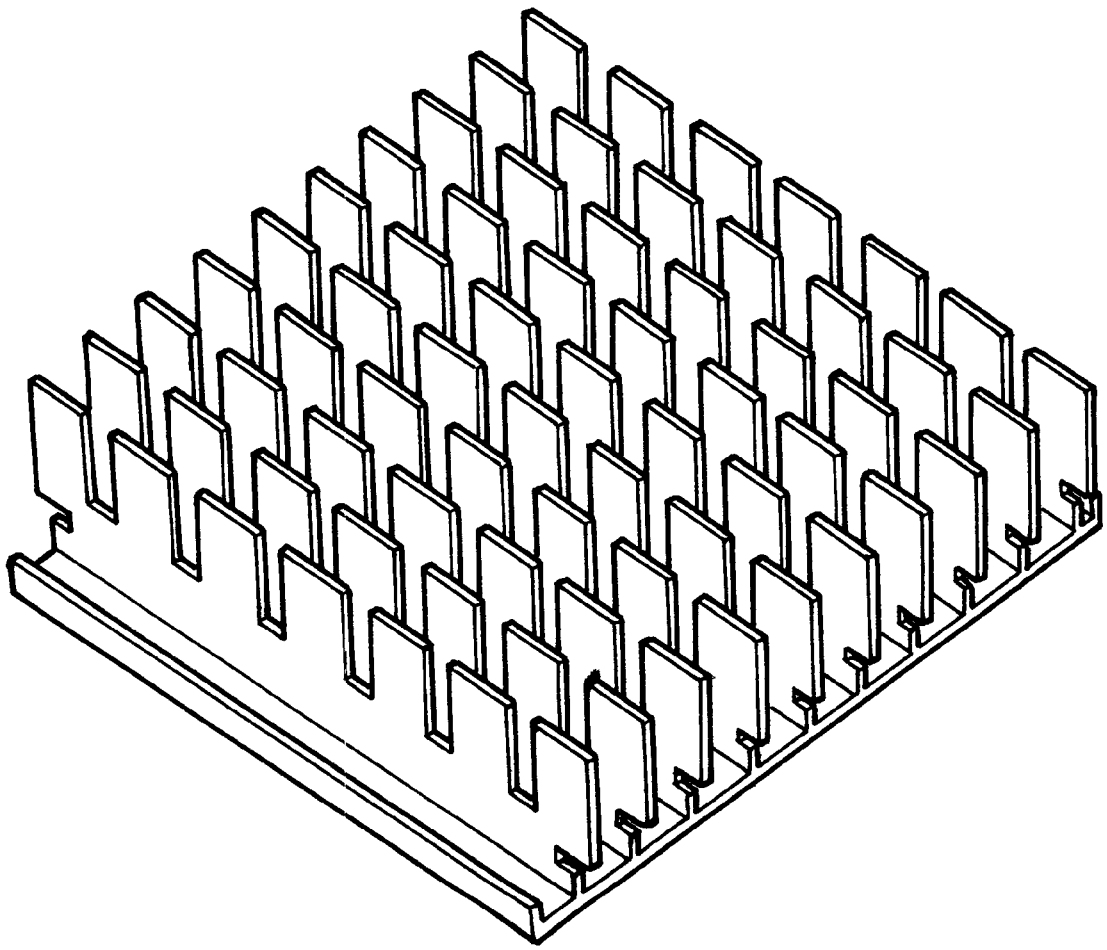
FIG. 1 is an elevational view of a heat sink according to the prior art.
Figure 2:
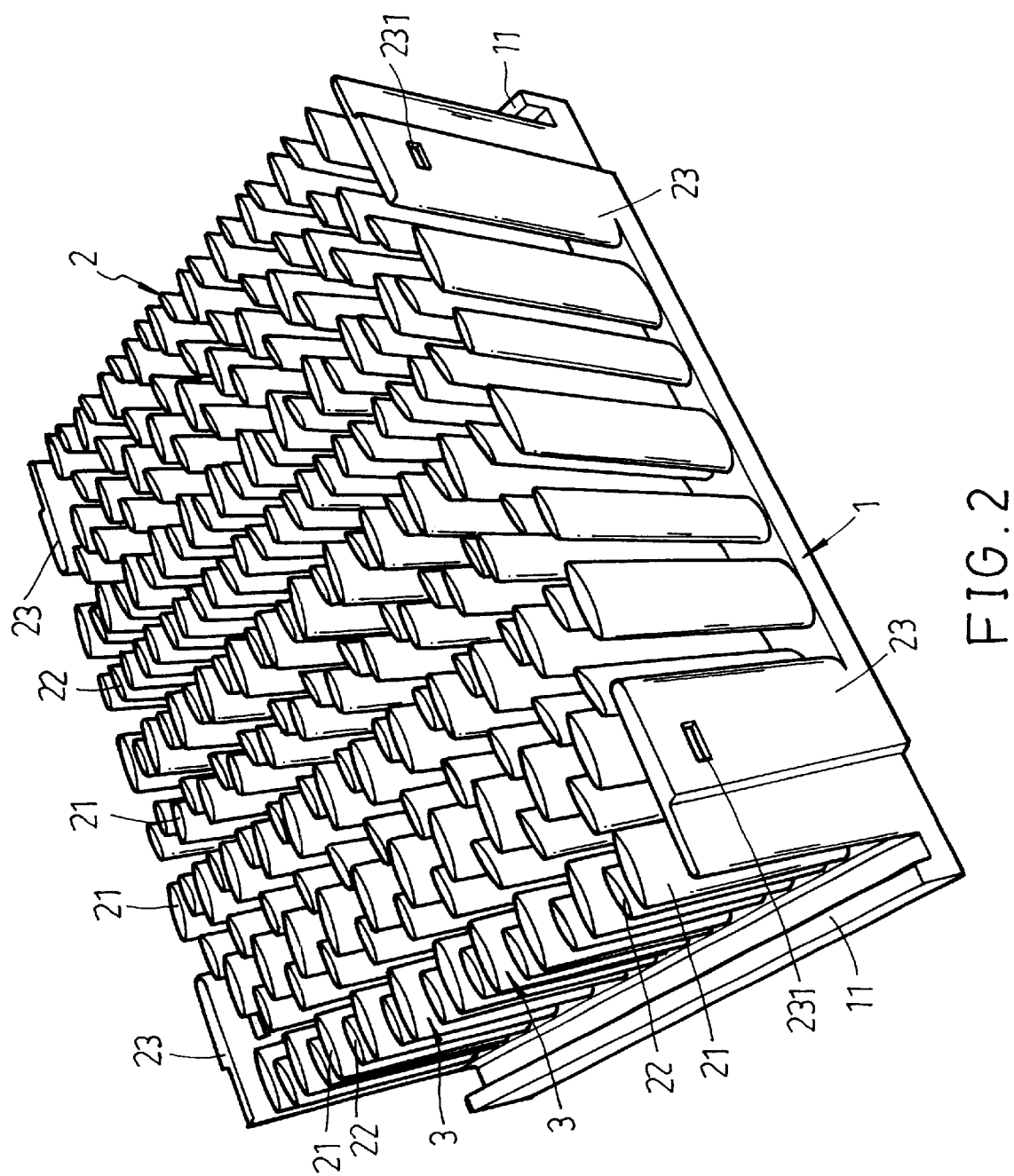
FIG. 2 is an elevational view of a heat sink according to the present invention.
Figure 3:
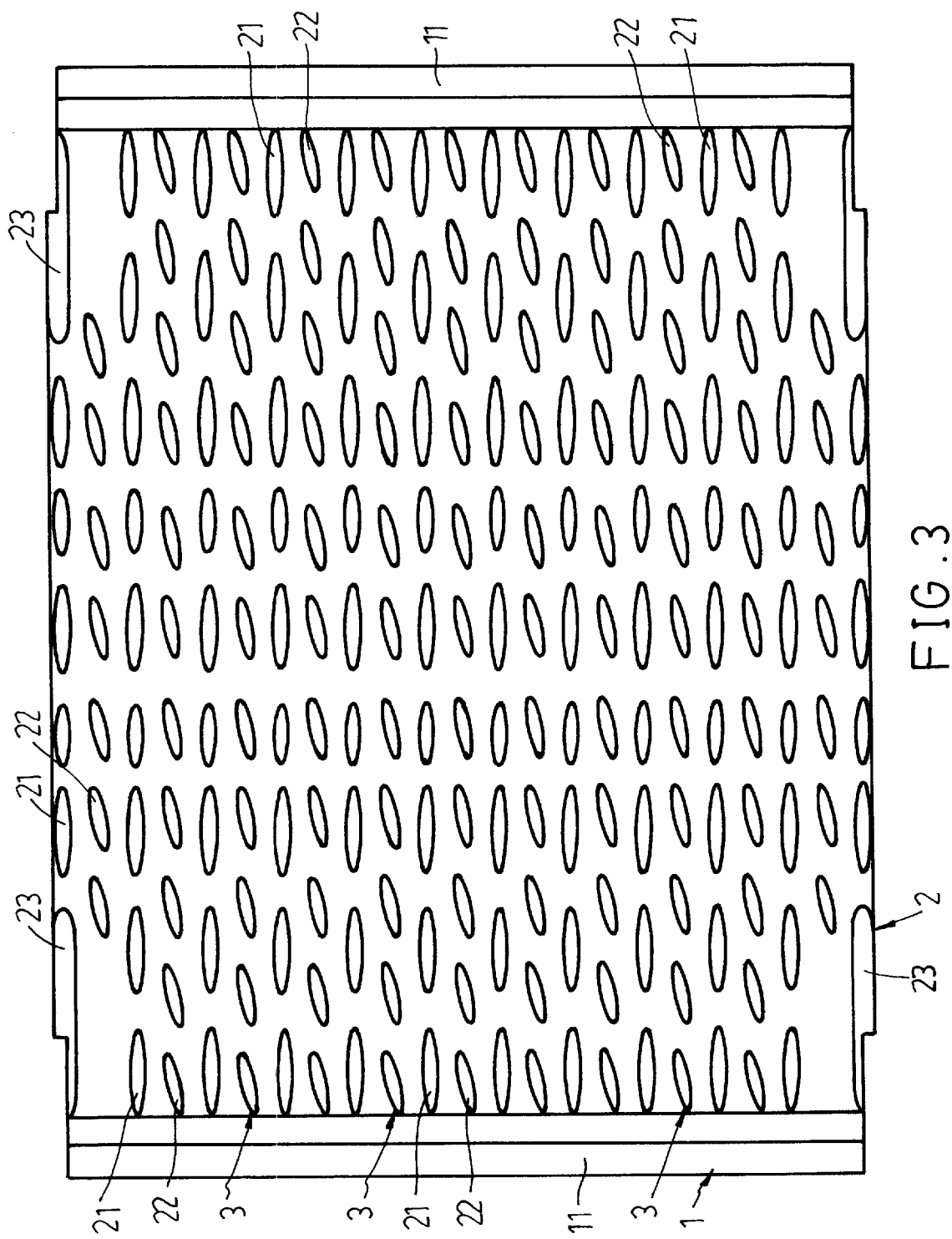
FIG. 3 is a top plain view of the heat sink according to the present invention.
Figure 4:
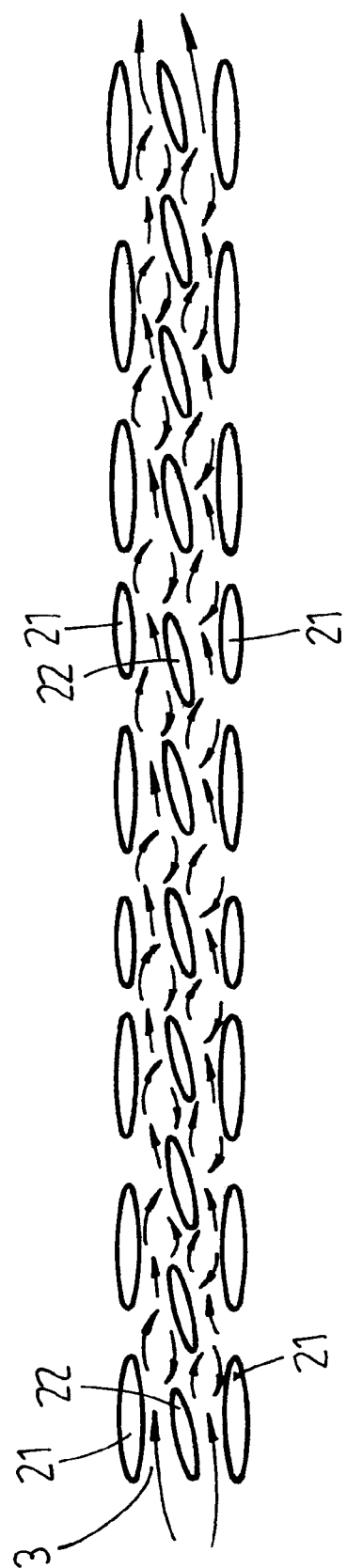
FIG. 4 is a schematic drawing showing currents of air passed through the air passageway between two parallel lines of parallel radiating fins over the flow guide fins.

Referring to FIGS. 2 and 3, a heat sink is shown adapted for securing to a CPU (central processing unit) to dissipate from it. The heat sink is made of magnesium or aluminum alloy through a combination procedure of extruding and die casting, comprising a flat base panel 1, a plurality of upright radiating fins 2 integral with the top sidewall of the flat base panel 1, and a plurality of parallel air passageways 3 defined by the upright radiating fins 2 and extended in Y-axis direction. The flat base panel 1 comprises two positioning flanges 11 for mounting. The two opposite sides of each radiating fin 2 are not disposed in parallel, i.e., each radiating fin 2 has a substantially ellipsoidal cross section with two ends smoothly curved at a radius with 0.1~0.35.

Referring to FIG. 3 and FIGS. 2 and 3 again, the radiating fins 2 include parallel radiating fins 21 arranged in parallel lines in X-axis direction at two sides of each air passageways 3, flow guide fins 22 arranged in lines in each air passageways 3 between each two lines of parallel radiating fins 21 at a biased angle about 11°, and locating fins 23. When currents of air flow through the air passageways 3, the flow guide fins 22 guide the currents of air to form a whirlwind, enabling heat to be quickly carried away from the fins 21 and 22.

The locating fins 23 are disposed in the four corners of the base panel 1, each having a retaining hole 231 for the fastening of retainer means to be used to secure the heat sink to the CPU.

While only one embodiment of the present invention has been shown and described, it will be understood that various modifications and changes could be made thereunto without departing the spirit and scope of the invention disclosed.

What the invention claimed is:

1. A heat sink for a central processing unit (CPU) and comprising:

a) a flat base panel;

b) a plurality of radiating fins extending outwardly from a surface of the flat base panel, each radiating fin having an elliptical cross-sectional configuration, the plurality of radiating fins being arranged in a plurality of spaced apart, parallel rows, each row having a plurality of spaced apart, parallel radiating fins, the radiating fins of each row being aligned with the radiating fins of an adjacent row; and, c) a plurality of flow guide fins extending outwardly from the surface of the flat base panel, the flow guide fins being located between adjacent spaced apart radiating fins and having a cross-sectional configuration oriented obliquely with respect to the radiating fins.

2. The heat sink of claim 1 wherein the flow guide fins are oriented at an angle of approximately 11° relative to an adjacent radiating fin.

3. The heat sink of claim 1 further comprising a plurality of locating fins, each locating fin having a retaining hole therein.

* * * * *